United States Patent [19]
Kinard et al.

[11] Patent Number: 5,287,081
[45] Date of Patent: Feb. 15, 1994

[54] MULTILAYER THIN FILM MULTIJUNCTION INTEGRATED MICROPOTENTIOMETERS

[75] Inventors: Joseph R. Kinard, Darnestown; De-xiang Huang, Gaithersburg; Donald B. Novotny, Bethesda, all of Md.

[73] Assignee: The United States of America as represented by the Secretary of Commerce, Washington, D.C.

[21] Appl. No.: 3,911

[22] Filed: Jan. 13, 1993

[51] Int. Cl.[5] .................... H01C 7/10; H01C 1/012
[52] U.S. Cl. .................... 338/24; 338/307; 338/310; 338/322; 338/329
[58] Field of Search ............ 338/24, 307, 308, 310, 338/312, 322, 329

[56] References Cited

U.S. PATENT DOCUMENTS

| | | |
|---|---|---|
| 839,985 | 1/1907 | Briston . |
| 1,390,743 | 9/1921 | Allcutt . |
| 2,075,733 | 3/1937 | Lazarus ............... 338/24 X |
| 2,937,218 | 5/1960 | Sampietro . |
| 3,607,445 | 9/1968 | Hines . |
| 3,767,470 | 10/1973 | Hines . |
| 3,979,226 | 9/1976 | Renner et al. . |
| 4,183,136 | 1/1980 | Colla ............... 338/308 X |
| 4,211,888 | 7/1980 | Stein et al. . |
| 4,257,822 | 3/1981 | Gomez . |
| 4,276,441 | 6/1981 | Wilson . |
| 4,363,927 | 12/1982 | Wilson . |
| 4,465,895 | 8/1984 | Verner et al. . |
| 4,850,713 | 7/1989 | Thery et al. . |
| 4,963,195 | 10/1990 | Kadato et al. . |
| 4,969,956 | 11/1990 | Kreider et al. . |
| 4,971,632 | 11/1990 | Rowe . |
| 4,983,225 | 1/1991 | Rowe . |

OTHER PUBLICATIONS

"Thermal Conductivity and Diffusivity of a Thin Film SiO2-Si3N4 Sandwich System", F. Volklein, Electronics and Optics, Thin Solid Films 188 (1990).

"Theoretical Analysis of the AC/DC Transfer Difference of the NPL Multijunction Thermal Converter Over the Frequency Range DC to 100 kHz", IEEE, vol. IM-21 (1972).

"A Proposal for a Multijunction Thermal Converter" G. Yonezaki et al., IEEE Transactions on Instrumentations and Measurement, vol. 18, No. 2 (1989).

"Accurate Radio-Frequency Microvoltages" Selb (1953).

"Accurate Thin Film Multijunction Thermal Converter on a Silicon Chip", M. Klonz et al., IEEE, Transactions on Instrumentation and Measurement, vol. 38, No. 2 (1989).

"A Monolithic Thermal Converter" Peter M. O'Neill.

Primary Examiner—Marvin M. Lateef
Attorney, Agent, or Firm—Lowe, Price, LeBlanc & Becker

[57] ABSTRACT

Multilayer, thin film multijunction integrated micropotentiometers are formed in an integral multifilm membrane form over a through opening in a nonmagnetic, dielectric substrate. Through the use of conventional photolithographic and etching techniques, integrated structures are formed to include either single elongate heater elements, bifilar heater elements, or trifilar heater elements with multiple return paths. Multijunction thermopiles and resistors are formed with the heater. The individual layers of silicon oxide or silicon nitride, are formed with conventional chemical vapor deposition, sputtering and other known techniques.

24 Claims, 7 Drawing Sheets

MULTILAYER THIN FILM MULTIJUNCTION INTEGRATED MICROPOTENTIOMETERS

FIELD OF THE INVENTION

This invention relates to multilayer, thin film, integrated micropotentiometers (MFI-μpots) suitable for use as primary and secondary calibration standards and for the measurement of ac and RF voltage, with the MFI-μpots used to measure and produce low voltages over a broad frequency range. More particularly, this invention relates to MFI-μpots which offer performance over very broad ranges of frequency, voltage and output-emf, with low ac-dc and RF-dc differences, in a form suitable for low cost mass production for inclusion in a variety of instruments.

BACKGROUND OF THE PRIOR ART

The addition of one or more previously formed resistors in series with the heater element of a thermal converter forms a micropotentiometer. The highest performance thermal converters are multijunction thermal converters (MJTCs).

Micropotentiometers are very precise standards for determining a low voltage output over a wide range of frequencies for ac-dc and RF-dc applications. To meet this need, integrated μpots require physical ruggedness, ability to withstand stresses associated with thermal cycling and in-use exposure to a wide range of temperatures locally, and an error-free structure, e.g., minimization of capacitances or inductances developed between the heater and thermopiles and/or the contact pads.

The best combination for structural elements for forming MJTCs and the output resistors required for the corresponding μpots includes: low stress sandwich-type multifilm membranes; low stress metal films for forming the heater element, thermopiles, contact-pads, and the like; minimization of capacitances between heater and thermopiles or between contact pads by precise definition of form and structure; a coaxial design, use of a relatively thick film nonmagnetic mounting substrate to support a chip containing thinner films constituting the heater element, thermopiles, resistors and contact pads; optional provision of guard thermocouples at both ends of each thermopile; and careful selection of materials so that, for example, the resistance heaters have a very low thermal coefficient of resistance and Thompson effect. The present invention incorporates such features in novel and highly reliable structures.

These and other related objects of this invention are described more fully hereinbelow, as are structural details of the preferred embodiments of this invention and methods of forming the same. Persons of ordinary skill in the art, upon understanding the following disclosure and the accompanying drawing figures may consider implementing obvious modifications and variations of this invention, and the claims appended hereto are intended to comprehend such variations of the explicitly disclosed embodiments.

SUMMARY OF THE INVENTION

A principal object of the present invention is to provide highly compact, low-cost, easy to manufacture, rugged, low stress, micropotentiometers (MFI-μpots) to measure and produce low ac voltages, at frequencies ranging from low audio frequencies to 1 GHz.

Yet another object of this invention is to provide low-cost, highly reliable, mechanically stable, low current MFI-μpots, including either a single or a bifilar or a trifilar heater element on a composite, stress-balanced, thin-film membrane, with low electrical capacitances and inductances between adjacent elements of the structure.

A related further object of this invention is to provide rugged, accurate, low stress multifilm, low-cost, MFI-μpots for precise measurement of low voltages and currents across a broad frequency range extending from low audio frequencies to 1 GHz, comprising thermocouples disposed about a precisely formed heater element electrically insulated therefrom. A related further object of this invention is to provide output resistors on the chip and a method for forming the above-described type MFI-μpot structures to provide the desired precise measurement capabilities.

These and other objects of this invention are realized by providing an integrated micropotentiometer formed on a substrate with a through aperture. A membrane is arranged over the through aperture and comprises a first layer of $SiO_2$, a second layer of $Si_3N_4$ and a third layer of $SiO_2$. A heater element is provided on the membrane over the aperture. A first plurality of serially-connected thin-film thermocouples are formed on one side of the heater and have their hot junctions formed over the aperture and their cold junctions formed over the semiconductor substrate outside of the aperture. A second set of serially-connected thin-film thermocouples is formed on the opposite side of the heater to that of the first plurality. The hot junctions of the second plurality are formed over the aperture and the cold junctions are formed over the semiconductor substrate. A plurality of resistor elements located on the chip are coupled in series at one end of the heater element and at least one possible current return path is arranged parallel to the heater element.

DETAILED DESCRIPTION OF THE PREFERRED EMBODIMENTS

There are many similarities between the structures for MJTCs and for integrated MFI-μpots formed according to this invention. The principal difference lies in the addition of thin film broadband resistors in series with the heater element to provide either single or multi-range integrated MFI-μpots having operational ranges of between 1 mV to 300 mV. An output voltage from the MFI-μpot is generated by the voltage drop across the resistor or resistors provided in series with the heater. Since the basic structure of the MJTC is thus somewhat simpler than that of a corresponding MFI-μpot, the former will be discussed first.

Experience in the manufacturing of semiconductor devices has led to the development of photolithographic techniques which enable the formation of extremely precise and regular geometries of thin film elements such as the heater elements, thermocouples, resistor elements and contact pads. Such techniques, spanning both thin film and thick film technologies, together with a planar structure for the devices, are found to satisfy the above-stated objects of this invention.

It is noted that the performance of the micropotentiometer will benefit from a low Thompson effect and a low Peltier effect. For this to be accomplished, the Thompson coefficient of the heater material should be small and the thermal couples used as part of the micropotentiometers should be disposed uniformly and symmetrically on opposite sides of the elongated heater element. To reduce the Peltier effect, the contact area between the heater and pads should be on a good heat sink. This is accomplished by placing the cold junctions of the thermocouple over a semiconductor substrate rather than over the aperture in the substrate.

Figure 1:
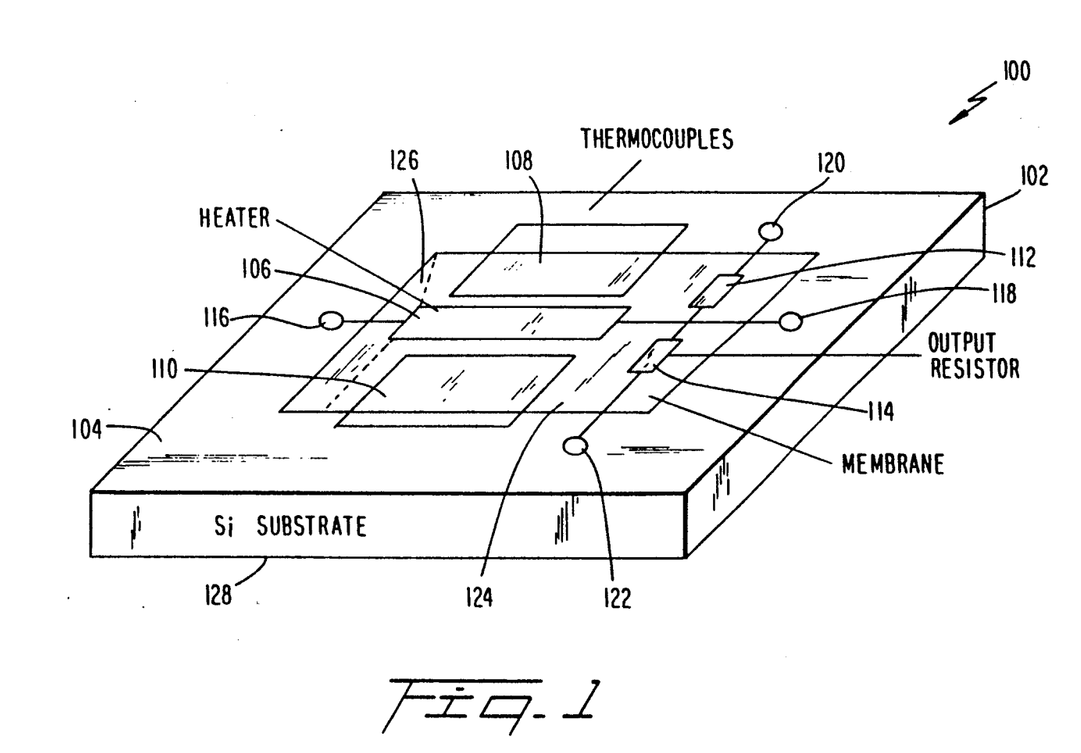
FIG. 1 is a perspective schematic view of an exemplary integrated MFI-μpot constructed according to the general principles of this invention.

Referring now to FIG. 1, there is seen in perspective schematic form an assembly comprising the essential elements of an exemplary integrated MFI-μpot structure 100. Both MJTCs and MFI-μpots according to this invention are formed on a dielectric substrate 102 having a planar upper or front surface 104 on which are to be formed a heater element 106, pluralities of thermocouples, i.e., thermopiles, 108, 110, exemplary resistors 112, 114, and exemplary contact pads 116, 118, 120 and 122. The substrate is most conveniently made of silicon or glass. A through opening 126 is formed in the substrate 102, and has a membrane 124 at surface 104. The heater element 106 and substantial portions of thermocouples 108 and 110 lie over the through aperture 126 as integrated parts of a multilayer membrane structure, as described below in greater detail.

It should be remembered that the structure illustrated in FIG. 1 is meant to be merely exemplary, i.e., only to facilitate an understanding of the relative dispositions of individual elements, without being limiting in other respects.

A preferred composition of the alloy used to form the heater element, available commercially as Evanohm TM, is as follows:
nickel: 75%
chromium: 20%
aluminum: 2.5%
copper: 2.5%

Other material with small temperature coefficient and Thompson coefficient can also be used. Suitable materials for forming thermocouples are: constantan (Cu and Ni) and chromel (10% Cr and 90% Ni) and many others.

Evanohm TM, constantan, etc. are suitable materials for forming the resistors for the MFI-μpots. Other known materials having suitable electrical resistivity may also be used.

The contact pads are preferably made of a highly conductive metal, e.g., aluminum, copper, or even gold if cost considerations are not limiting.

The materials employed to form the thermocouples, resistors, pads, etc., are preferably applied by sputtering. Other alternatives include evaporation of the selected materials or printing with ink containing the same. Any affordable and reliable known apparatus or technique for forming uniform thin films may be utilized. The preferred structure eventually includes an integrated plurality of films, including dielectric layers formed of materials such as $SiO_2$ and $Si_3N_4$, preferably applied by a known technique such as chemical vapor deposition, organic reduction, evaporation, plasma enhanced deposition, or sputtering.

One of the keys to forming the MFI-μpots according to the present invention is to produce low-stress, multilayer films. To do this, initially, a heat sink (not shown) is attached to the back of a silicon wafer 102 to keep it at close to room temperature. Selected materials for the heater element 106, the thermocouples 108, 110, resistors 112, 114, assorted insulation layers and the contact pads 116-122 are then applied with the use of masks. If sputtering is used, the sputtering rate is kept low and is adjusted as needed to ensure that the resulting structure will have low residual stresses. Another adjustable parameter in the process of applying the selected layers is the distance between the target, i.e., source of the material to be deposited, and the substrate surface on which the material is to be deposited. The through opening 126 is initially formed by etching the silicon substrate 102 from its rear surface part way through the thickness thereof, with the residual thickness of silicon removed by etching only after the key elements, i.e., the heater element 106, the thermocouples 108, 110, etc., are formed. This leaves a stress-free, stable, multifilm structure stretched over the through opening.

To minimize problems that would otherwise be generated during use of the finished device at the interface between the heated material of the heater element and the silicon surface contacted thereby and regions immediately surrounding the heater, the present invention thus employs a low-stress, multifilm, composite membrane which has both a high thermal efficiency and high mechanical stability. The $SiO_3$—$Si_3N_4$—$SiO_2$ sequence provides lower dielectric loss than $Si_3N_4$—$SiO_2$—$Si_3N_4$, and therefore better electrical performance of the heater, and reduces the risk of surface cracks due to defects. The preferred combination of steps to form the desired structural layers will now be described. Details of the various elements which cooperate to form various embodiments of the MFI-μpots follow.

As generally indicated in FIG. 1, the heater element 106 is thermally isolated by its location on a thin dielectric membrane 124 which stretches across and over an opening 126 formed in silicon substrate 102. The hot junctions of each thermopile 108, 110 are disposed symmetrically in close thermal proximity to heater element 106. The cold junctions of each of the thermocouples comprised within thermopiles 108, 110 are, correspondingly, symmetrically disposed to be on a portion of the thin dielectric film which is an extension of the thin dielectric membrane 124 and which stretches over the silicon substrate 102 to provide good thermal contact therewith. Dielectric membrane 124 is actually a multifilm composite formed in successive steps over an initially continuous silicon substrate 102, i.e., the dielectric membrane 124 is formed before opening 126 is created.

First, a silicon substrate 102 of suitable size and thickness is etched from the lower or rear surface 128 by any conventional technique so that its thickness is reduced in the region in which opening 124 is to be formed, the etching leaving a thickness of silicon in the range 10 to 100 $\mu$m. This reduced thickness portion is to provide initial support for the dielectric membrane 124 which is to be formed thereover in the course of fabricating the MFI-$\mu$pot structure. Then, after the MFI-$\mu$pot structure is completely fabricated, the remaining thickness of the silicon substrate in the region of opening 126 is entirely etched away, leaving the MFI-$\mu$pot as an integral part of the dielectric membrane and supported by it. This requires precise alignment of any masks used in the etching of silicon substrate 102 and/or any masks used in defining and forming the heater element, thermocouples, junctions, contact pads and the like.

For present purposes, the basic silicon wafer may be of approximately 100-600 $\mu$m nominal thickness, polished on both sides. A silicon dioxide film is then grown on both sides thereof to a thickness in the range 100 to 700 nm nominal thickness. The term "grown" is used herein to describe a process of oxidizing the silicon wafer surface to produce a strongly adherent silicon dioxide film thereon. As the oxidation process continues, the thickness of the oxide film thus increases or "grows". Both sides of the silicon wafer are then coated with photoresist patterned so that the patterns on the two sides are aligned with respect to each other. The mask to be applied to the front side of the wafer provides alignment marks and the mask for the back side of the wafer provides definition for etching the openings 126 for a plurality of devices to be formed from a single silicon wafer. The alignment of the two masks is done in a conventional fixture which brings the imaged sides of both the masks together, i.e., permits visual observation of both simultaneously, and also permits controlled lateral movement of the masks relative to one another until the images are observed to be in desired alignment. The masks are then held in this chosen alignment while separated apart from each other, and a wafer provided with photo-resist coatings on both sides is inserted therebetween. The masks are then brought together and each side of the photoresist-coated silicon wafer is exposed, thereby transferring each masked image onto the wafer surface. Other alignment methods for both sides can be used. The images thus formed are then etched into the silicon dioxide surface, preferably with buffered hydrofluoric acid. The photoresist is then stripped in conventional manner and a nominal 100 nm to 2 $\mu$m thick silicon nitride film is deposited onto the wafer the silicon dioxide surface, preferably by a known chemical vapor deposition (CVD) process.

Both sides of the wafer are coated again with another layer of a photoresist, and the original back side mask is aligned to its original image which is now formed in the silicon dioxide film on the back side of the coated wafer, and the photoresist with the mask in place is again exposed. The pattern thus formed on the back side of the silicon wafer is plasma etched through the silicon nitride coating, preferably with "Freon 114" gas to form openings (i.e., windows) penetrating through both the silicon nitride and silicon oxide layers down to bare silicon. Note that the front side of the wafer is not thus etched because it is protected by the hitherto unpatterned photoresist layer. The patterned silicon nitride film at the rear surface of the wafer now serves as an etching mask to form the openings 126, which are etched through the thickness of the silicon wafer to within 10 to 100 $\mu$m of the front surface of the wafer, preferably with a 10 to 70% weight aqueous solution of potassium hydroxide held in a temperature range of 40° to 142° C.

A low temperature silicon dioxide (LTO), in a thickness of 10 to 400 nm, is then deposited on the front surface of the silicon wafer. On the LTO thin film of silicon dioxide, a thin film in the range of 30 to 600 nm thickness of low stress Chromel TM is then sputter-deposited. The surface of the thin Chromel TM film is coated with photoresist and the first legs of the thermocouples which are to provide the thermopiles are aligned to the alignment marks patterned onto the front surface of the silicon wafer and are patterned into the resist. The photo- resist is then cured and the Chromel TM layer is etched in a perchloric acid based etchant. The photoresist is thus stripped and the surface cleaned by plasma ashing in oxygen for several minutes. The wafer is then dipped for several second in diluted perchloric acid based etchant, washed in deionized water, and dried. A low stress, nominally 30 to 600 nm thick constantan film is sputter deposited on the front surface over the patterned Chromel. The constantan is then etched in an aluminum etchant, the photoresist stripped and the wafer then plasma ashed for several minutes in oxygen.

A nominal 30 to 500 nm thick CVD LTO film is deposited on the front side of the silicon wafer. On this silicon oxide LTO layer, a 30 to 600 nm thick Evanohm TM film of low stress is sputter deposited. This Evanohm TM film is coated with a photoresist and the heater structure is patterned in alignment with the thermocouple hot junctions formed earlier. The Evanohm TM is then etched in perchloric acid based etchant. The photoresist is then stripped, the wafer is plasma ashed for several minutes in oxygen, and another layer of 20 to 300 nm thick CVD LTO silicon dioxide film is then deposited thereover.

The surface of the LTO silicon dioxide film is then coated with photoresist and windows corresponding to electrical contact pads are patterned thereon and etched through the LTO layer to enable electrical contacts to be made to the thermocouples and heater elements. The photoresist is then stripped, the wafer is plasma ashed in oxygen, and a nominally 100 to 1000 nm thick layer of pure aluminum is sputter deposited thereon. The aluminum layer is then coated with another layer of photoresist, and contact pads are patterned thereon and etched with an aluminum etchant. This completes the formation of the low stress, multifilm structure of the typical MJTC chip. Actually, depending on the selected patterns, a multitude of the devices are thus formed on the relatively large silicon wafer.

It will be readily understood that if MFI-$\mu$pots are to be formed in this manner an electrically resistant material such as Evanohm TM can be applied to form individual resistors connected as desired to the heater element. Details of various structures comprehended within the present invention are provided below.

Kerfs are cut approximately half way through the wafer thickness in the streets between individually patterned devices which are to be diced from the silicon wafer. The silicon wafer surface is then protected with hard black wax or similar, and the remaining 10 to 100 μm thickness of the silicon substrate corresponding to the through openings in each of the devices is etched away in hot KOH. The black wax is then removed with xylene and the individual devices are separated from each other by breaking the relatively larger silicon wafer at the various kerfs.

The above-described process of making MFI-μpots according to this invention provides devices that have certain very valuable attributes. Thus, for example, with the generally available, high-precision masking and etching equipment now commercially available, the entire planar structure of the device can be formed with extremely regular geometry. This is important for the manufacture of primary standards, which is a principal objective of this invention. It is also very important that the temperature gradient along the heater element be very small, i.e., one would ideally like to have a heater structure with an entirely uniform temperature to reduce errors that may otherwise arise from thermoelectric effects like Thompson heating, and the like. Furthermore, the thermopiles formed in precise relationship to the heater element all present essentially a uniform thickness of the chosen metals to the elongate edges of the heater, so that there is a very uniform thermal conduction path along the entire length of the heater and between the heater and the thermopiles uniformly disposed in correspondence therewith. This ensures a very uniform temperature distribution along the heater length and is important for forming precise standards.

The time constant for the typical MFI-μpot according to this invention is in the range 5 to 300 msecs. This is quite fast compared to what is available in the known art. A very rapid time constant may not be desirable because, if one reduces the frequency of the ac received by the heater element, the heater temperature begins to track the variations of the ac waveform and then one no longer has an ac to dc thermal converter anymore. It should be remembered that the heat output of a heater receiving ac has a thermal output with twice the frequency of the input ac because the phase of the current is irrelevant in generating thermal energy. It should also be remembered that the electrical output of the thermopiles is proportional to the thermal power generated by the heater element. A thin layer of glass or other dielectric material with low dielectric constant and losses may be added to increase the time constant of the device to avoid tracking of the heater power peak frequency by the thermopile output, especially at low ac frequencies.

It is believed that if a high quality dielectric, e.g., glass, is used instead of silicon to provide additional mass in the heater and hot junction area, it should be possible to increase the thermal time constant even for use of thermal converters down to low audio frequency or even a little below. If the thermal time constant can be kept short enough, e.g., in the order of 10 to 200 msec it should be possible to have high speed measurements from a device which works at low audio frequencies. No known device exists for such measurements.

Thermal characteristics can also be improved by the use of a mounting substrate made of ceramic, silicon, glass, metal or similar material. The mounting substrate holds the substrate on which the integrated micropotentiometer is formed. Yet better thermal characteristics can be achieved through the use of a ceramic lid arranged over the mounting substrate to cover the entire micropotentiometer and any wiring to external devices.

Another aspect of the present invention that is particularly helpful for defining standards is the provision of guard couples at the ends of the heater element, whether the heater elements are coaxial or bifilar. Such guard couples are merely thermocouples provided at the very ends of the thermopiles to permit a user to monitor nonuniformities associated with the end portions of the heater element structures. These guard thermocouples are provided with their own contact pads to enable selective use or disuse as desired. In this manner, selective manipulation of the output from the thermopiles can be used to compensate for or make corrections for what are essentially structural limitations.

Basically, one uses thermal converters by applying an unknown ac and observing the output emf in the thermopiles, and then applying a known dc and bringing the output to the same level. If the ac/dc difference of the thermal converter is zero, so that its performance with ac is the same as its performance with dc, then one has succeeded in comparing the rms value of the ac to the corresponding known and precisely measured value of the dc. In other words, the thermal converter is used to precisely monitor any difference between ac and dc in the primary standard environment or in the primary calibration laboratory environment.

When used with instrumentation, thermal converters may be used to receive an input signal, e.g., an ac input, for comparison thereof with some internal reference such as a known dc reference voltage. The structures formed according to this invention enable such comparisons, with very small errors across a much broader band width than existing primary standards. Because of the thin film structures and precise definition of the various elements in the thin films, the MFI-μpots according to this invention should provide very high thermal efficiency and, consequently, the need for very low power inputs. Furthermore, with a large number of thermocouples provided in each of the thermopiles, even with very low inputs it should be possible to generate signals of the order of 100 mV and, if the devices are mounted in a vacuum, the sensitivity will possibly be two to ten times higher.

In considering the detailed descriptions of the MFI-μpots provided below, it should be remembered that the resistors incorporated therein are integrated with the same multifilm structure as the other elements, e.g., the heater, thermocouples, contact pads and the like. As described more fully hereinafter, the output resistors in the MFI-μpots are preferably located on or over the substrate to provide better ac performance. Furthermore, the connection between the heater element and the output resistor or resistors can be kept very short, e.g., of the order of 2 to 40 μm away from the heater. With such high definition of structure, it should be possible to minimize errors significantly. Such precise MFI-μpots are useful for the measurement and generation of small voltages, e.g., less than 200 mV down to even smaller voltages at high frequencies. By "high frequency" in this regard is meant a frequency above a megahertz and up into hundreds of megahertz. In the MFI-μpots according to this invention, the current which flows through the heater element also flows through a low value output resistor. Assuming a zero ac/dc difference, one may set the ac current to the value compared to a dc current by using the basic thermal converter structure. If the reactance errors in the output resistor are zero, then the voltage drop across the output resistor on ac should be the same as the voltage drop on dc. It should be remembered that MFI-μpots are rms transfer devices. The MFI-μpots provided herein are particularly suitable for low voltage, low frequency standards. By the provision of a plurality of resistors of different values with appropriate contact pads, the user is afforded the selectivity of a multi-range, highly compact, rugged, precise MFI-μpot.

In terms of their overall structure, the principal difference between an MJTC and a MFI-μpot is the addition in the latter of selected resistor provided in series with the heater element. Consideration must be given to the so-called "skin effect" which occurs when high frequency ac flows through a conductor. It is well known that alternating current tends to flow along the outer surfaces of the conductor instead of the inner bulk thereof. This skin effect is frequency dependent, so that the effective electrical resistance is different with ac than it is with dc. Therefore, if one employs low resistance conductors, like the output resistors on the MFI-μpots, the skin effect becomes significant. This is particularly true in the low voltage ranges.

As noted earlier, a key structural difference between MJTCs and MFI-μpots is that the latter include one or more electrical resistors in series with the heater element. Various embodiments of such MFI-μpots are described below.

Figure 2:
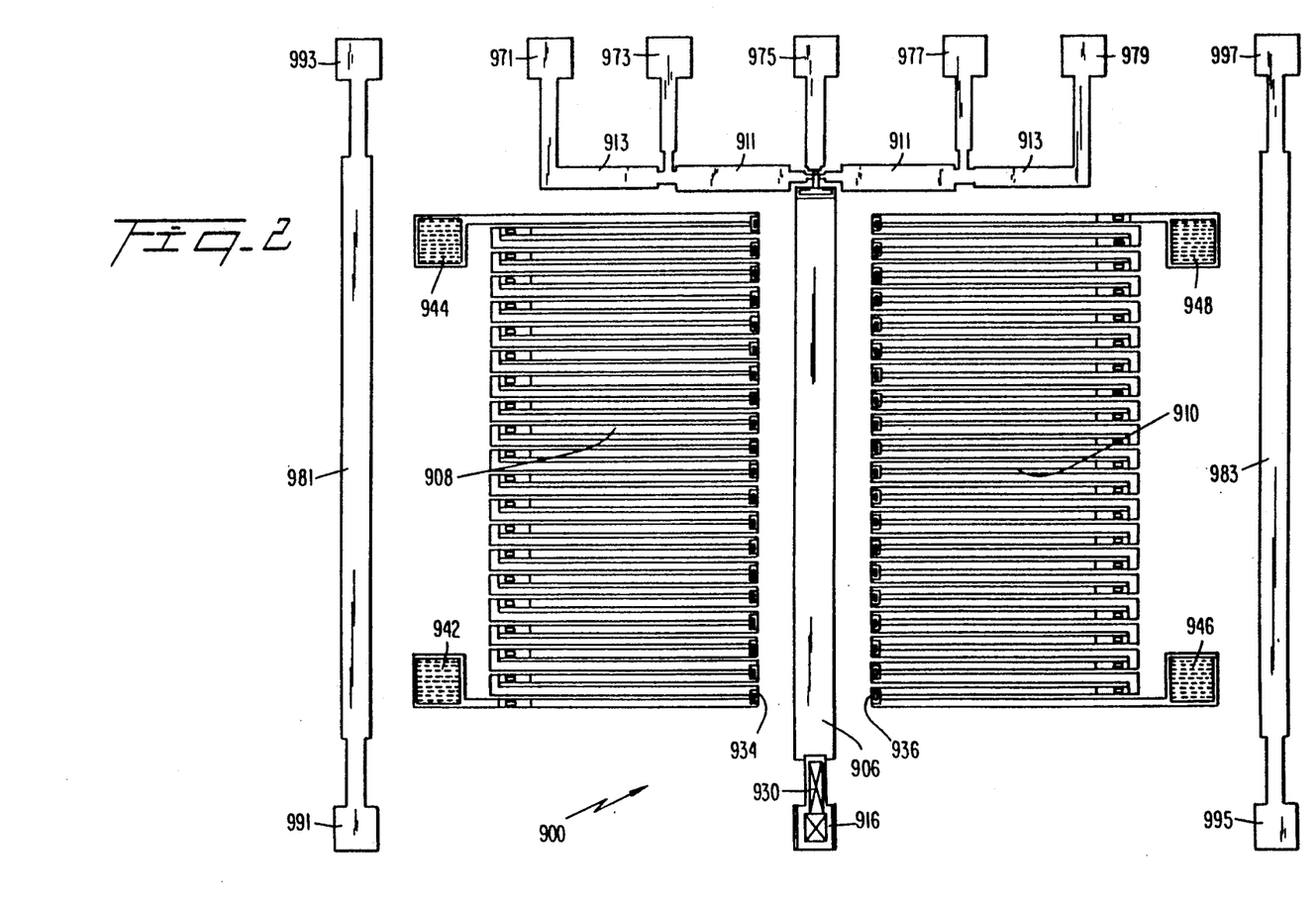
FIG. 2 is a plan view of a first preferred embodiment of a MFI-μpot including a plurality of thin-film resistors which enable a multi-range operation.

FIG. 2 is a plan view of a MFI-μpot 900 which comprises a single linear elongate heater element 906 provided with an input contact pad 916 at one end. MFI-μpot 900 also comprises thermopiles 908 and 910 symmetrically disposed with respect to heater element 906. Electrical contact pads 942, 944, 946 and 948 are provided for electrical connection of thermopiles 908 and 910, as best seen in FIG. 2. Since 900 is a MFI-μpot, it is provided with two output resistors 911 and 913, each of a different resistance value, on each side. Each set of differently-valued output resistors 911 and 913 can be electrically accessed by appropriate selection of electrical contact pads 971, 973, 975, 977 or 979, which are disposed as best seen in FIG. 2.

FIG. 2 also includes two exemplary outside electrical paths, i.e., thin layers of highly conductive material, 981 and 983 which may be formed as part of the integrated multilayer structure on the upper surface of the dielectric substrate (not shown for simplicity). These electrical paths 981 and 983 may be provided with electrical contact pads 991, 993, 995 and 997, as illustrated in FIG. 2. Return paths 981, 983 can be connected to other elements of the micropotentiometer and outside sources using wire bonds on the chip, soldered links on the substrate (if ceramic). The return paths can also be wired to the surrounding metal casing. It should be noted that the return paths do not have to be used at all and other means can be used to complete the heater circuit. The MFI-μpot 900 may thus be made part of an instrument circuit or an external test circuit. The heater element, the thermopiles, the differently-valued output resistors, and the outside electrical paths of the MFI-μpot structure can thus be electrically connected and the individual elements accessed and employed as previously described. A very important consideration is to avoid unnecessary current division on ac-dc difference devices, because ac never divides in the same way as does dc. The reason is that ac depends not just on the pure electrical resistance encountered in its path but on reactance. This reactance, as is well understood, will depend on the various capacitances and inductances which may be present, depending upon the layout of the various elements. One key to minimizing such problems is to have small precisely dimensioned structure and regular geometry. As previously described, and as illustrated in FIG. 2, with conventional techniques of photolithography and with suitable masks very precisely defined elements can be formed and accurately disposed. With a MFI-μpot structure as illustrated in FIG. 2, one can select an operational range by receiving the output current, whether ac or dc, from heater element 906 across a selected pair of contact pads 971, 973, 975, 977 or 979. Depending on which pair of these electrical contact pads is selected, one would have a different set of resistors, and hence a different reactance, being employed. One can, in this manner, obtain a very rugged, precise and multi-range MFI-μpot. Because the various films are very thin, and there are rather severe limitations on the sizes of the electrical resistors 911 and 913, it is convenient to make the different resistors from different metals having different specific electrical resistivities. Persons of ordinary skill in the art, provided with this teaching, can be expected to create a variety of modifications to the described structures.

In the known types of μpots, the current flows through a thermal heater element along a long wire, which is one of the undesirable aspects eliminated by the multifilm integrated structures described herein. In particular, it should be noted with reference to FIG. 2 that there are only very short current paths between adjacent resistors and heater elements. Furthermore, in conventional μpots, the current flows along the heater wire element to a disc resistor at the end of an enclosure surrounding the μpot. The current then flows through the disc resistor and the outside of the metal enclosure. In such a structure, the voltage drop across the disc resistor is what is used as the output voltage from the μpot. By contrast with such known devices, a MFI-μpot such as 900 has several different types of current return paths and options for readily selecting the current return path depending on exactly which type of application for which the MFI-μpot is to be used, e.g., whether it is wired inside an instrument and generates a small reference voltage or whether it is going to be mounted in some kind of cylindrical can or enclosure and used as a working standard or a primary standard. Although not illustrated in FIG. 2, additional current paths may be provided and employed in conjunction with those which are illustrated.

Figure 3:
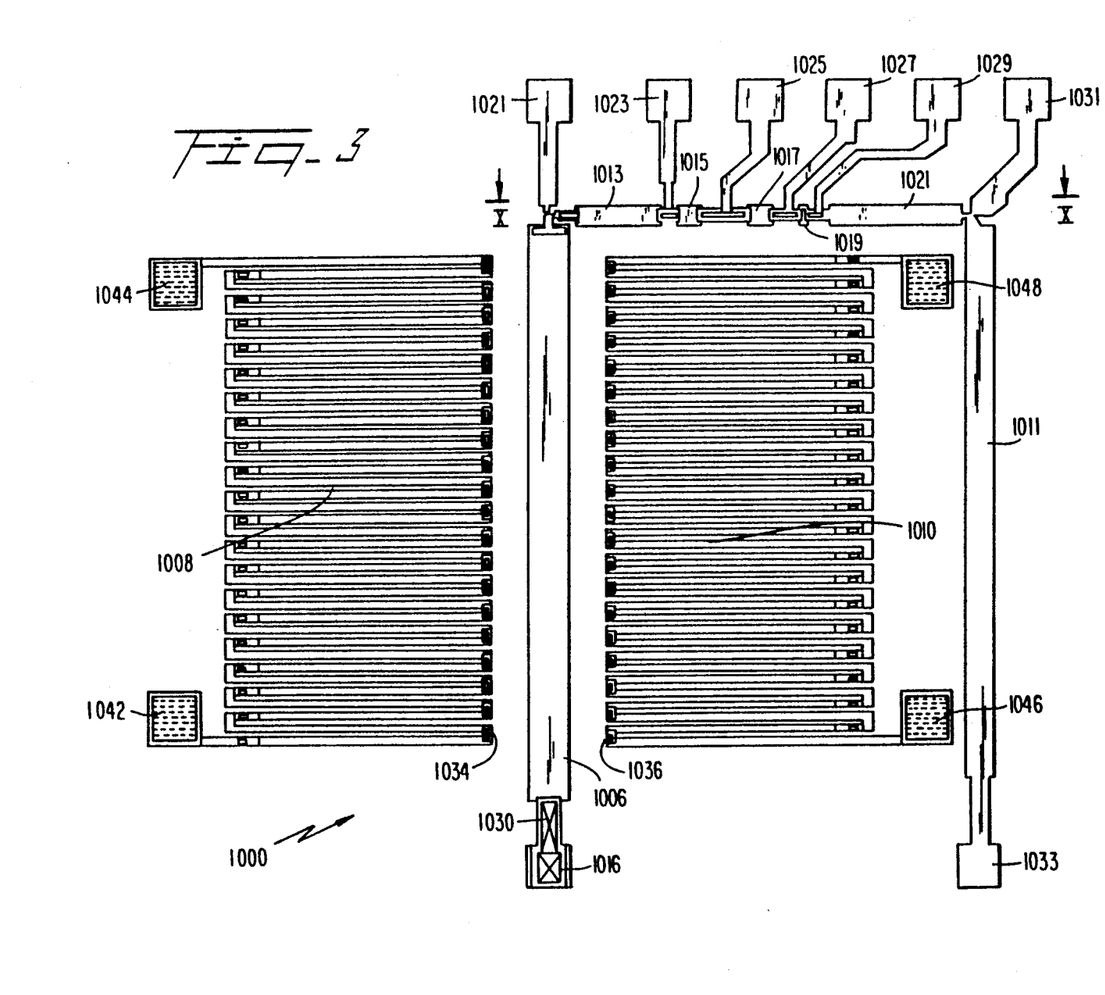
FIG. 3 is another embodiment of a MFI-μpot according to this invention, comprising a plurality of thin-film output resistors and electrical contact pads coupled with an outside return current path to provide multi-range operation.

FIG. 3 illustrates a somewhat modified form of a MFI-μpot 1000 with other variations in the disposition of output resistors and current paths or MFI-μpot structures according to this invention.

Note that in MFI-μpot 1000, as in MFI-μpot 900, only heater 1006 is disposed between the hot junctions of thermopiles 1008 and 1010. Output resistors 1013, 1015, 1017, 1019 and 1021 may be formed to provide selective resistance values, by appropriate selection of size and/or resistive material as previously described. An assortment of small electrical contact pads 1021, 1023, 1025, 1027, 1029, 1031 and 1033 may be readily formed for selective engagement of the various resistances provided. In this manner, a highly versatile multi-range, precise and sturdy MFI-μpot is available for use as a primary or working standard.

Figure 4:
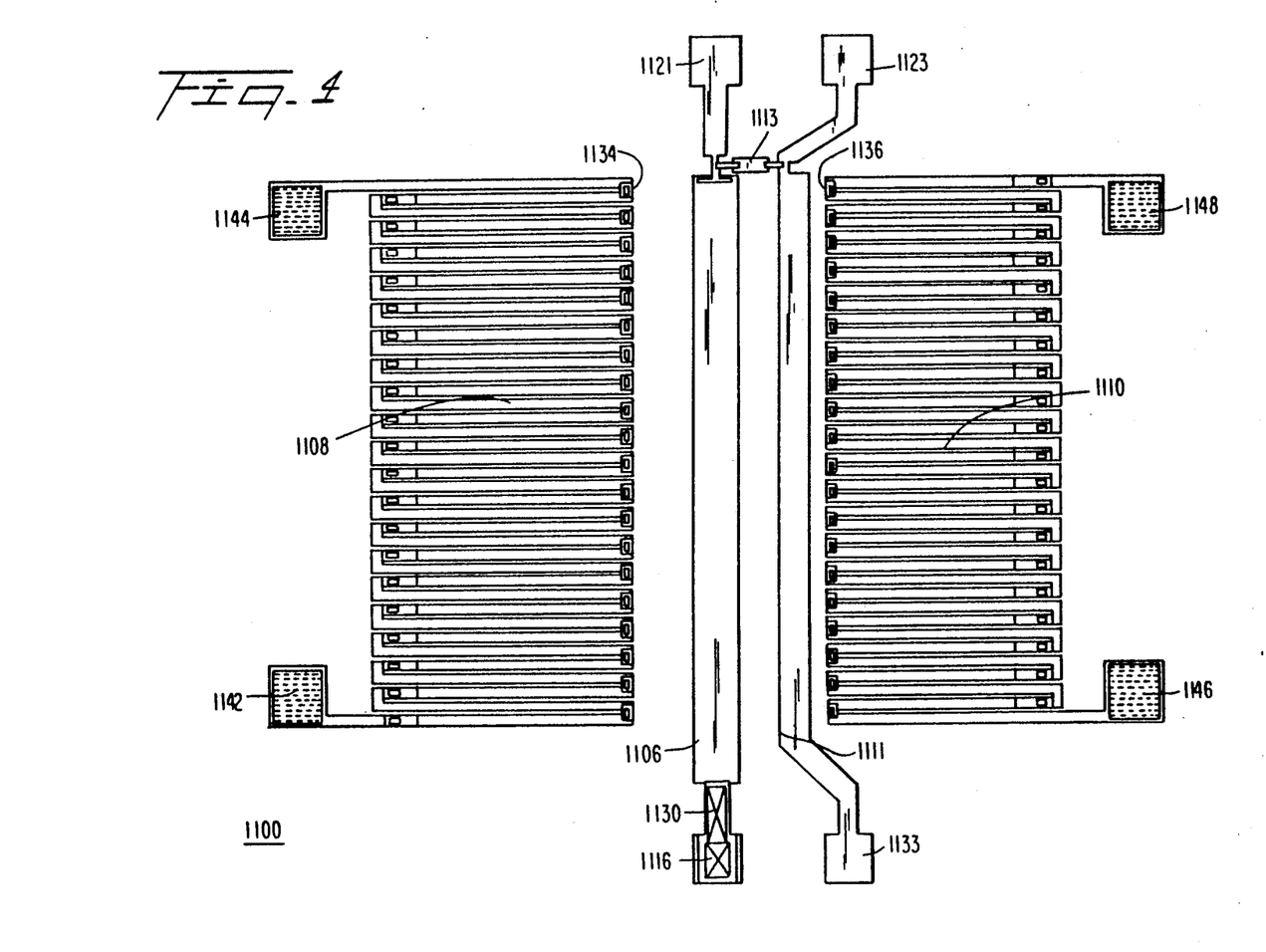
FIG. 4 is yet another embodiment of a MFI-μpot wherein the return current path is disposed between the hot junctions of adjacent thermopiles.
Figure 5:
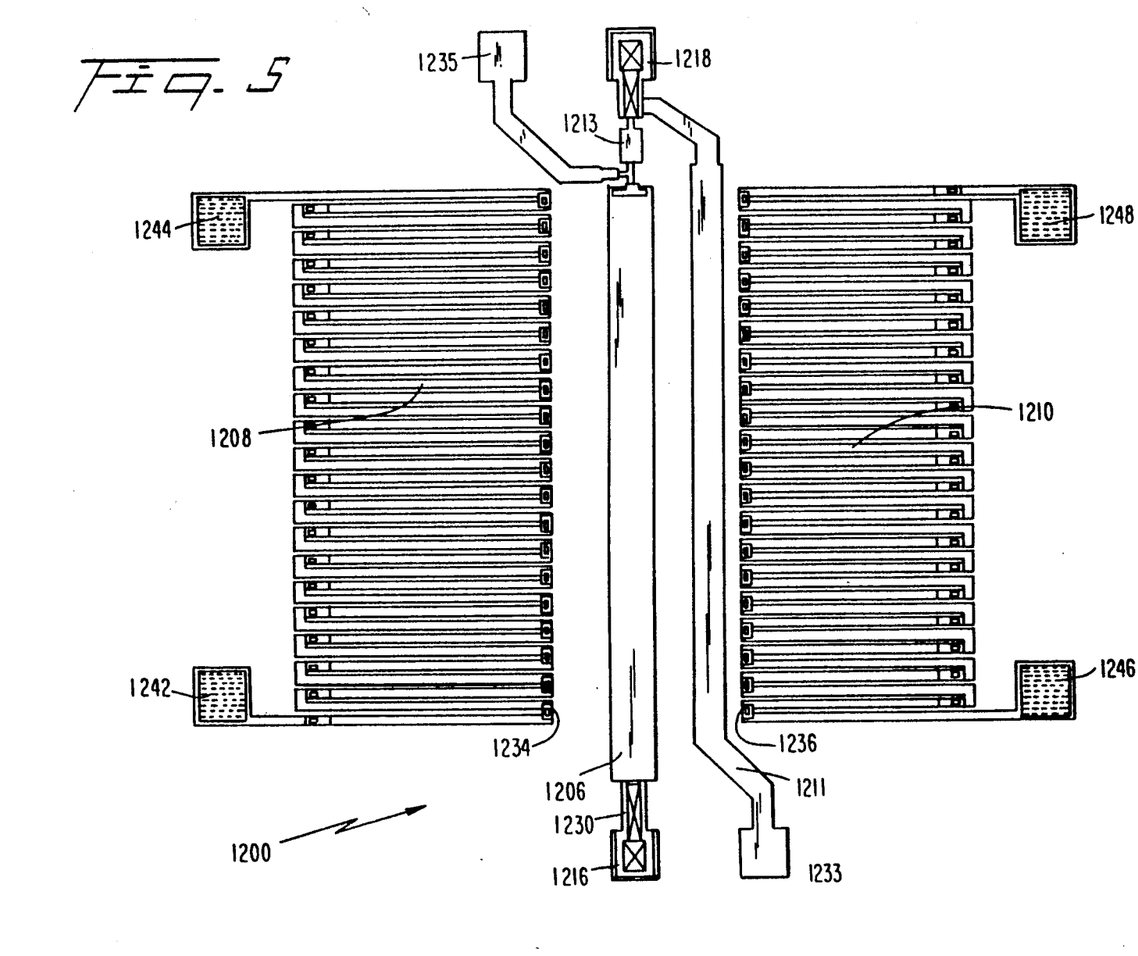
FIG. 5 is yet another embodiment of a MFI-μpot which is a modification of the embodiment illustrated in FIG. 4.

Micropotentiometers 1100 and 1200, in FIGS. 4 and 5 respectively, illustrate other variations of the same basic concept, except that in both of these embodiments the return path is disposed between the hot junctions of their respective thermopiles disposed on opposite sides of the central linear elongate heater. The various corresponding elements are numbered consistently with comparable elements in the various embodiments described earlier in greater detail.

Figure 6:
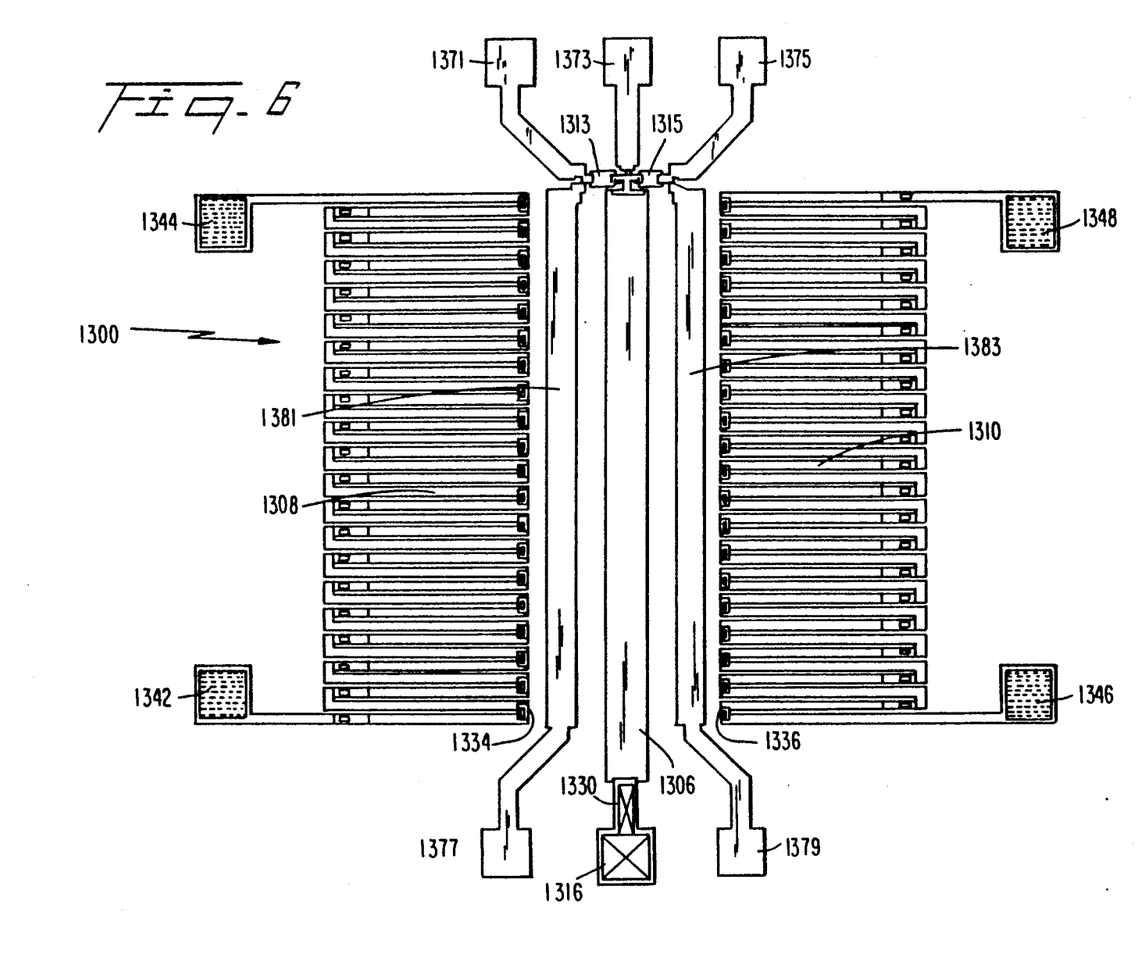
FIG. 6 is a trifilar MFI-μpot provided with a trifilar geometry containing a pair of symmetrically disposed current return paths parallel to a single linear elongate heater element and between the hot junctions of adjacent thermopiles.

The MFI-μpot 1300, illustrated in FIG. 6, differs from those previously described in that it has a symmetry along the axis of the single linear elongate heater element, with two parallel symmetrically disposed current paths between the hot junctions of thermopiles 1308 and 1310. It should be appreciated that although the electrical resistances are shown in different sizes in the various figures, the figures are themselves not necessarily drawn to scale and the electrical resistance values depend only in part on the physical size of the resistances and also depend on the resistivity of the material employed to form the various output resistors.

For high frequency type micropotentiometers, or those having coaxial or bifilar heating arrangements, contact pads for the heater should be made as small as possible in order to eliminate capacitive current. The contact pads should be in the range of $50 \times 50$ $\mu m^2$ to $400 \times 400$ $\mu m^2$. These types of micropotentiometers are usually characterized by heaters having a length from 20 μm to 8000 μm, a width of 1 μm to 1200 μm and a length to width ratio of 4 to 800. With high current type micropotentiometers heater contact pad size is not critical. The heater size for such devices typically range between a length of 20 μm to 8000 μm, a width of 10 μm to 6000 μm and a length to width ratio of 0.1 to 10.

Figure 7:
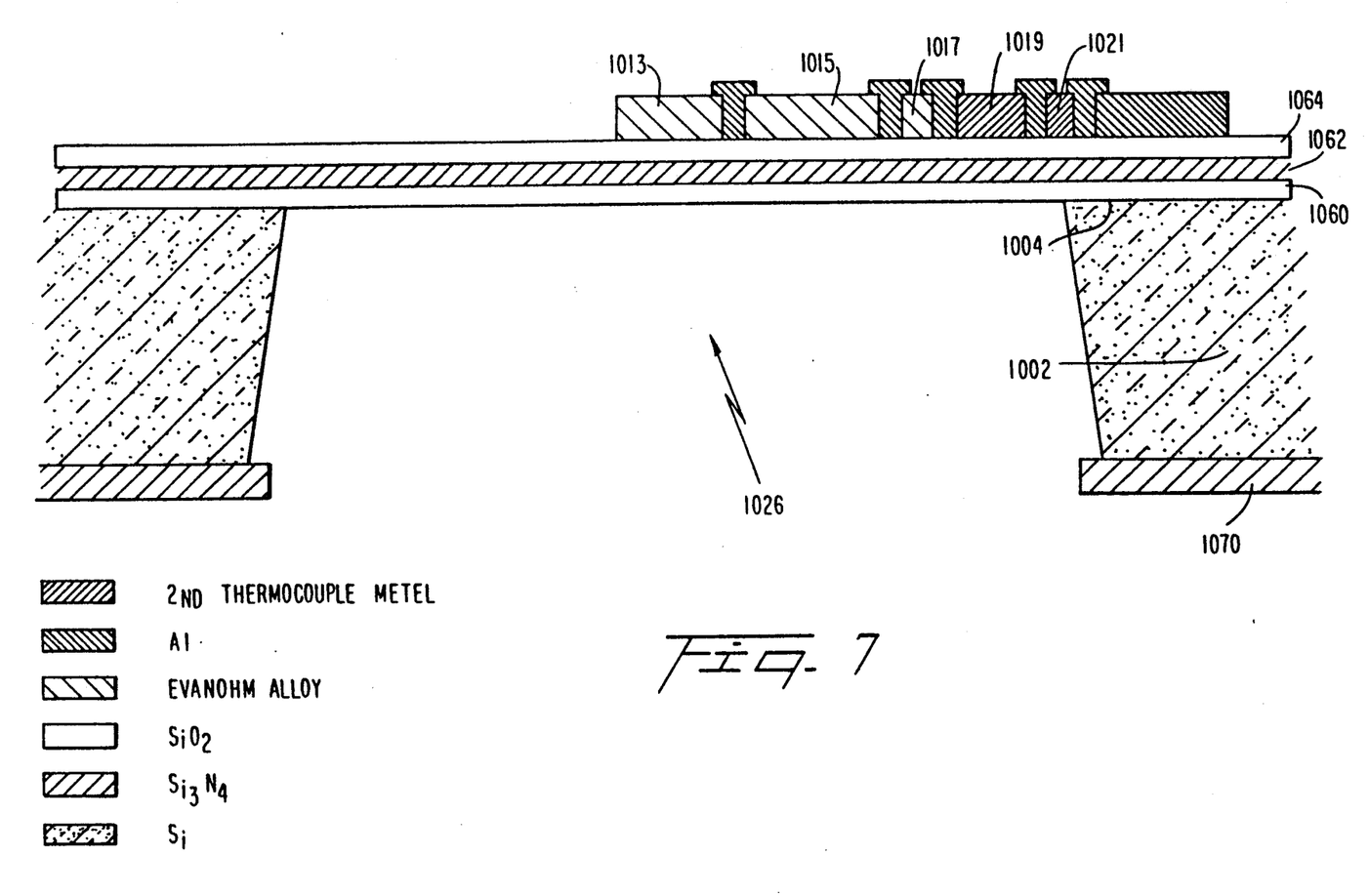
FIG. 7 is a transverse cross-sectional view of the MFI-μpot illustrated in FIG. 3 at Section X—X therein.

FIG. 7 is a cross-sectional view at Section X—X in FIG. 3. It is provided merely to emphasize that the various resistors are formed as integrated parts of the multilayer membrane structure disposed over the through opening in the dielectric substrate.

In disposing return current paths between the hot junctions of the thermocouples, it must be kept in mind that there are two types of coupling of ac into the thermocouples which are to be avoided. One is capacitive coupling. This can be reduced by careful disposition of the elements, e.g., by disposition of the heater element and the hot junctions over the through opening through the dielectric substrate, whereby the individual capacitances and capacitive coupling can be minimized.

It should also be appreciated that in devices like the MFI-μpots just described, the current return path is essentially at ground potential so that it has a shielding effect to the thermocouples so that there is actually less direct capacitance to the thermocouple.

The other type of coupling in the thermocouples is inductive in nature. To minimize this, for low frequency applications, one may use something like a bifilar or trifilar heater. Note, in particular, that with MFI-μpot 1300 (see FIG. 6) the return current leaving the heater splits and returns symmetrically between the heater and the adjacent thermopiles so that there is a more even and better cancelling of the inductance and, therefore, less inductive coupling into the thermocouples. The key, to the extent possible, is to ensure that there is comparable reactance (and not just resistance or inductance) of the structure on both sides of the heater element.

In the present invention, because of the highly precise techniques employed, the various geometries can be made very accurately. Thus, for example, one can separate the hot junctions of the thermocouples from the adjacent edge of the heater element by 50 μm exactly, on both sides and all along the heater edges. Furthermore, all the lines corresponding to the various elements and adjacent thermocouples can be made very straight, to a much higher degree than was possible in the prior art with the use of fine wires.

The term "trifilar" may be used for the type of structure illustrated in FIG. 6 for MFI-μpot 1300, i.e., a structure in which an ac or dc flow through a central heater and flow back in the opposite direction through two symmetrically disposed return paths. Generally, however, the MFI-μpot which has the most ranges on it has just one current path between the hot junctions of the thermopiles, namely through the single linear heater element. Examples of these may be seen in FIGS. 3, 4, and 5.

It should also be appreciated that there is a significant difference between the "potential leads", i.e. the leads for monitoring the voltage across the output resistors, and the "current carrying leads", namely the leads which bring in and take away current to the heater element and resistors. Reactance in the current carrying leads and in the potential leads is critically important to the MFI-μpot performance. Note that in the described structures the interconnecting leads between adjacent output resistors can be made as short as 2 to 200 μm. One cannot produce interconnecting leads like these unless they are actually fabricated as part of the structure, and with precise photolithographic techniques this is relatively easy in accordance with the present invention. The reactance errors due to such interconnecting leads are relatively large in ordinary multi-range μpots which are made from discrete components. However, with the present invention, such reactance errors are virtually eliminated.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. An integrated micropotentiometer, comprising:
   a substrate formed of a predetermined thickness of a dielectric material, having a front surface and a rear surface with a through aperture of predetermined shape and size formed therebetween;
   a first layer of $SiO_2$, formed on the front surface of the substrate to extend over the through aperture in the substrate;
   a first layer of $Si_3N_4$, formed on the first layer of $SiO_2$, to also extend over the through aperture in the substrate;
   a second layer of $SiO_2$, formed on the first layer of $Si_3N_4$ so as to also extend over the through aperture in the substrate and to provide a mounting surface;
   a layer of an electrically resistive material provided on the mounting surface to form a thin elongate heater element having two longitudinal parallel sides and first and second ends, the heater element being shaped and sized to be entirely contained within a periphery of the through aperture in the substrate as defined at the front surface of the substrate in the lateral direction and to extend beyond the periphery of the aperture in the longitudinal direction;

a plurality of first serially-connected thin-film thermocouples, formed and disposed to have their respective cold junctions over the substrate and outside of said periphery of the through aperture and their respective hot junctions arrayed side-by-side overlying the through aperture;

a plurality of serially-connected second thin-film thermocouples, formed and disposed to have their respective cold junctions over the substrate and outside of the periphery of the through aperture on an opposite side thereof with respect to the hot junctions of the first thermocouples, with the respective hot junctions of the second thermocouples overlying the through aperture;

a plurality of resistor elements coupled in series at one end of said heater element, each said resister element having an electrical pad so that said micropotentiometer provides a plurality of output voltages; and, at least one current return path arranged parallel to said heater element.

2. The integrated micropotentiometer according to claim 1, wherein said pluralities of first and second serially-connected thermocouples are symmetrically disposed on either side of said heater element.

3. The integrated micropotentiometer according to claim 1, wherein said first layer or $SiO_2$ is formed in compressive stress, said first layer of $Si_3N_4$ is formed in tensile stress and said second layer of $SiO_2$ is formed in compressive stress so that said stresses are balanced to result in a net stress close to zero in value.

4. The integrated micropotentiometer according to claim 3, further comprising:

a second layer of $Si_3N_4$ formed on the rear surface of the substrate so as to entirely surround a periphery of the through aperture at the rear surface of the substrate.

5. The integrated micropotentiometer according to claim 1, wherein the Thompson effect is reduced by uniform position of said first and second serially connected thin-film thermocouples.

6. The integrated micropotentiometer according to claim 3, further comprising a plurality of current return paths.

7. The integrated micropotentiometer according to claim 3 wherein at least one said current return path is arranged outside of said pluralities of said first and second serially-connected thermocouples.

8. The integrated micropotentiometer according to claim 3, further comprising two symmetrically disposed current return paths between said pluralities of said first and second serially-connected thermocouples constituting a trifilar micropotentiometer.

9. The integrated micropotentiometer according to claim 3, further comprising:

first low impedance electrical pads respectively connected to the first and second ends of the heater element and to said return path to enable provision of a controlled electrical current to the heater element; and second electrical pads connected to extreme ends of each of said pluralities of first and second serially-connected thin-thermal couples to enable electrical connection thereof to an external circuit, wherein said heater element has a length of 20 $\mu$m to 800 $\mu$m, a width of 1 $\mu$m to 1200 $\mu$m and a length to width ratio of 4 to 800, and said first electrical pads have an area of $50 \times 50$ $\mu m^2$ to $400 \times 400$ $\mu m^2$.

10. The integrated micropotentiometer according to claim 5, further comprising guard thermocouples arranged on both sides of and in alignment with said pluralities of said first and second serially-connected thermocouples, said guard thermocouples having electrical pads separate from those of said first and second pluralities of thermocouples.

11. The integrated micropotentiometer according to claim 1, wherein the material of said substrate is selected from a group including silicon, ceramic, silicon dioxide, silicon nitride, polyamide and similar materials.

12. The integrated micropotentiometer according to claim 1, wherein said pluralities of said first and second serially-connected thermocouples and heater element are arranged to have a cumulative thermal time constant between 5 msec. and 300 msec.

13. The integrated micropotentiometer according to claim 5, wherein an output of 10–200 mv is contained at said electrical pads connected to said pluralities of said first and second serially-connected thermocouples.

14. The integrated micropotentiometer according to claim 5, further comprising at least one additional layer of $SiO_2$ formed over said pluralities of said first and second serially-connected thermocouples, said heater element and said output resistors.

15. The integrated micropotentiometer according to claim 3, further comprising:

first low impedance electrical pads respectively connected to the first and second ends of the heater element and to said return path to enable provision of a controlled electrical current to the heater element; and second electrical pads connected to extreme ends of each of said pluralities of first and second serially-connected thin-film thermocouples to enable electrical connection thereof to an external circuit, wherein said heater element has a length of 20 $\mu$m to 8000 $\mu$m, a width of 20 $\mu$m to 6000 $\mu$m and a length to width ratio of 0.1 to 10.

16. The integrated micropotentiometer according to claim 1 wherein said heater element is selected from a group including Evanohm TM, nickel-chromium alloys and similar materials with small Thompson effect and low temperature coefficients of resistance.

17. The integrated micropotentiometer of claim 14 further comprising a plurality of openings in said additional layer of $SiO_2$.

18. The integrated micropotentiometer according to claim 3, further comprising a mounting substrate for holding said substrate, and wiring between said heater element, said output resistors said cold junctions of said first and second thin-film thermocouples and external devices.

19. The integrated micropotentiometer according to claim 1, further comprising:

a ceramic lid arranged over said first and second pluralities of serially-connected thin-film thermocouples, said heater element, said output resistors, said wiring and said mounting substrate.

20. The integrated micropotentiometer according to claim 1, wherein said heater element comprises two longitudinally arranged resistive elements connected to the output resistor at a first end and connected to separate electrical pads at a second end forming a bifilar structure.

21. The integrated micropotentiometer according to claim 18, wherein the material of said mounting substrate is selected from a group including ceramic, silicon, glass, and metal.

22. The integrated micropotentiometer according to claim 1, wherein said pluralities of first and second serially-connected thermocouples are asymmetrically disposed on either side of said heater element.

23. The integrated micropotentiometer according to claim 1, wherein said first layer of $SiO_2$ has a thickness of 20-700 nm, said layer of $Si_3N_4$ has a thickness of 20-700 nm, and said second layer of $SiO_2$ has a thickness of 20-700 nm.

24. The integrated micropotentiometer according to claim 1, further comprising a metal housing enclosing said micropotentiometer wherein said metal housing constitutes at least a portion of said return path.

* * * * *

UNITED STATES PATENT AND TRADEMARK OFFICE
CERTIFICATE OF CORRECTION

PATENT NO. : 5,287,081
DATED : February 15, 1994
INVENTOR(S) : Joseph R. KINARD et al.

It is certified that error appears in the above-indentified patent and that said Letters Patent is hereby corrected as shown below:

On the title page, item [56] References Cited the section entitled "Other Publications" should read as follows:

--"Thermal Conductivity and Diffusivity of a Thin Film SiO2-Si3N4 Sandwich System", F. Volklein, Electronics and Optics, Thin Solid Films 188 (1990).
"Theoretical Analysis of the AC/DC Transfer Difference of the NPL Multijunction Thermal Converter Over the Frequency Range DC to 100 kHz", F.J. Wilkins, IEEE Transactions on Instrumentation and Measurement, Vol. IM-21, Nov. 1972.
"A Proposal for a Multijunction Thermal Converter", G. Yonezaki et al., IEEE Transactions on Instrumentation and Measurement, vol. 18, No. 2 (1989).
"Accurate Radio-Frequency Microvoltages", M.C. Selby, AIEE Trans., vol. 72, May 1953.

UNITED STATES PATENT AND TRADEMARK OFFICE
CERTIFICATE OF CORRECTION

PATENT NO. : 5,287,081
DATED : February 15, 1994
INVENTOR(S) : Joseph R. KINARD et al.

It is certified that error appears in the above-indentified patent and that said Letters Patent is hereby corrected as shown below:

"Accurate Thin Film Multijunction Thermal Converter on a Silicon Chip", M. Klonz et al., IEEE, Transactions on Instrumentation and Measurement, vol. 38, No. 2 (1989).
"A Monolithic Thermal Converter", P.M. O'Neill, Hewlett Packard J., May 1980.--

Signed and Sealed this

Fifteenth Day of August, 1995

Attest:

BRUCE LEHMAN

Attesting Officer      Commissioner of Patents and Trademarks